United States Patent
Rickes et al.

(10) Patent No.: US 6,667,896 B2
(45) Date of Patent: Dec. 23, 2003

(54) GROUPED PLATE LINE DRIVE ARCHITECTURE AND METHOD

(75) Inventors: Juergen T. Rickes, Los Altos Hills, CA (US); Hugh P. McAdams, McKinney, TX (US); James W. Grace, Los Altos Hills, CA (US); Scott R. Summerfelt, Garland, TX (US); Ralph H. R. Lanham, Cupertino, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 10/154,647

(22) Filed: May 24, 2002

(65) Prior Publication Data

US 2003/0218898 A1 Nov. 27, 2003

(51) Int. Cl.[7] .................................................. G11C 11/22
(52) U.S. Cl. ................................... 365/145; 365/230.06
(58) Field of Search ................................ 365/145, 149, 365/230.06; 257/295, 296

(56) References Cited

U.S. PATENT DOCUMENTS

| | | | |
|---|---|---|---|
| 5,524,093 A | * 6/1996 | Kuroda ........................ | 365/145 |
| 5,724,283 A | 3/1998 | Tai | |
| 6,111,777 A | * 8/2000 | Ogiwara et al. ............. | 365/145 |
| 6,288,931 B1 | 9/2001 | Kye et al. | |
| 6,295,223 B1 | * 9/2001 | Choi et al. ................... | 365/145 |
| RE37,409 E | 10/2001 | Barth et al. | |
| 6,314,018 B1 | 11/2001 | Pochmuller | |

* cited by examiner

Primary Examiner—Son Mai

(57) ABSTRACT

An integrated circuit device includes a two-dimensional array of ferroelectric memory cells in which plate lines within the array are grouped. The grouping of plate lines accommodates the use of larger plate line drivers, such as CMOS driver inverters. Each plate line group may include some but not all of the rows of memory cells and some but not all of the columns of memory cells within the array.

24 Claims, 4 Drawing Sheets

GROUPED PLATE LINE DRIVE ARCHITECTURE AND METHOD

TECHNICAL FIELD

The invention relates generally to memory devices and more particularly to driving ferroelectric capacitors within an array of ferroelectric random access memory cells.

BACKGROUND ART

There are a number of different types of integrated memory technologies. In a particular application, the selection of the type of memory will depend upon the requirements of the application. It is typical to use dynamic random access memory (DRAM) for dense storage of data where periodic memory refreshing is not an issue, while static random access memory (SRAM) is best suited for small but fast data storage and data retrieval where the large cell size of SRAM is acceptable. Flash memory provides nonvolatile storage of data, so that the data will still be available after power has been terminated. Selecting the memory technology on the basis of the application is more difficult when the needs occur within the same integrated circuit chip, such as within a system on a chip (SOC) design. One difficulty is the different memory technologies require different fabrication steps and specialized processes to individually maximize their performances.

One solution to the difficulties that arise when there is a desire to use the advantages of all three memory technologies (i.e., DRAM, SRAM, and Flash) within a single integrated circuit chip is to use the memory technology referred to as ferroelectric random access memory (FeRAM). FeRAM provides high data density, like DRAM, does not require a periodic memory refresh, unlike DRAM, and retains data when power is terminated, similar to Flash memory.

With reference to FIG. 1, a portion of a FeRAM array 10 is shown as including four memory cells 12, 14, 16 and 18. Within the FeRAM array, the memory cells are arranged in rows and columns. Merely by example, there may be 512 rows and 1024 columns of memory cells. Each FeRAM memory cell includes a pass transistor 20 and a ferroelectric capacitor 22. As is well known in the art, data storage in a ferroelectric capacitor 22 is through charge polarization to a "0" or a "1" state. In the orientation shown in FIG. 1, the bottom electrode of the ferroelectric capacitor 22 is referred to as the plate electrode. Plate lines (PL) 24 and 26 link the plate electrodes of each capacitor within a row. Similarly, word lines (WL) 28 and 30 couple all of the pass transistor gates of the same row. Bit lines (BL) 32 and 34 connect all of the corresponding source/drains of a particular column, so that data can be written into the ferroelectric capacitors. As one example, in order to polarize the ferroelectric capacitor 22 of the first memory cell 12 to a "0" state, the pass transistor 20 of that cell is activated via the first word line 28, while the corresponding bit line 32 is at "0" and the appropriate plate line 24 is set at "1." On the other hand, to polarize the same ferroelectric capacitor 22 of the memory cell 12 to a "1" state, the word line 28 activates the pass transistor, the bit line 32 is forced to a "1" and the appropriate plate line 24 forces a "0" to the plate electrode of the capacitor. In a read operation, the plate electrode of the ferroelectric capacitor is pulsed "high" and the capacitor will dump the polarization charge associated with a "1" or "0" through the memory cell pass transistor onto the bit line.

One issue in the design of a FeRAM array 10 is the selection of a plate-line architecture for driving the plate lines 24 and 26. As one possibility, a global plate line driver may be connected to all of the plate lines, so that the rows share the same connection. This global plate line architecture is represented in FIG. 2, which shows a single driver 36 connected to 512 rows. The advantage of the architecture is that the single driver 36 does not require a large amount of chip real estate, so that the required area efficiency is relatively high. A disadvantage is that at any one time there is one active row and 511 unselected rows that nevertheless contribute to the total capacitive load. The resulting relatively high capacitive load slows the rise and fall times of the plate line signal. Thus, the speed of the FeRAM array must be slowed accordingly. Another disadvantage is that since all connected memory cells experience disturb pulses even when they are unselected, the plate electrode of every ferroelectric capacitor within the array will recurringly experience the disturb pulses as the plate driver 36 is cycled.

An alternative plate drive architecture is shown in FIG. 3. In this segmented architecture, there is a single global plate line driver 38, but every local plate line (LPL) is connected to the driver through a transmission gate 40. Typically, the transmission gate is an NMOS device (n-channel metal oxide semiconductor device), with the global plate driver 38 being a CMOS device (complimentary metal oxide semiconductor device). The advantage of the architecture of FIG. 3 relative to the architecture of FIG. 2 is that the use of the transmission gates reduces the capacitive load on the global plate line driver 38, so that the operational speed of the memory array may be increased. A disadvantage is that the NMOS transmission gates require voltage boosting at their transistor gates in order to overcome the threshold of the NMOS device. As the desire for low voltage circuitry increases, this voltage boosting requirement increases in its importance. Another concern is that unselected bit lines will be allowed to "float" electrically, unless additional circuitry is used to tie unselected lines to electrical ground.

Another plate line architecture is represented in FIG. 4. In this architecture, each row of a ferroelectric memory array has a separate plate line driver 42. The drivers may be NMOS devices that require the voltage boost described with reference to FIG. 3. Thus, the use of the architecture in low-voltage applications is difficult. Moreover, the large number of drivers reduces the area efficiency of the memory array.

While the use of transmission gates or plate line drivers is not described, an alternative arrangement of connecting plate electrodes in a FeRAM memory array is set forth in U.S. Pat. No. 6,314,018 to Pöchmüller. Specifically, the patent describes an arrangement in which all of the plate electrodes of more than one word line row (or alternatively more than one bit line column) are connected to form a plate line segment.

The availabilities of the different prior art architectures allow a FeRAM memory array designer to select an architecture on a basis of a variety of factors, including available chip real estate and the target supply voltage (e.g., low-voltage application). However, each architecture also has disadvantages. What is needed is a FeRAM integrated circuit design and plate drive method which enable low-voltage, area-efficient implementations and which control the capacitive load placed on plate drivers, so that the integrated circuit may be operated at a relatively fast speed.

SUMMARY OF THE INVENTION

An integrated circuit device includes n lines by m lines of memory cells that are grouped with respect to common connections to plate electrodes of ferroelectric capacitors. Each group includes shared connections to ferroelectric capacitors of more than one of the n lines and more than one of the m lines. In one embodiment, the n lines are rows of memory cells and the m lines are columns of the memory cells. The multi-row, multi-column grouping of plate line connections enables greater flexibility with regard to the selection of a plate line drive scheme that satisfies both voltage-related requirements and area-related limitations.

While each group of plate line connections links ferroelectric capacitors of more than one column and more than one row, each group typically includes less than all of the columns and less than all of the rows. The selection of the number of columns and the number of rows within a group is based upon factors that include the total numbers of rows and columns and the intended type of plate line drivers. CMOS plate line drivers require a greater amount of chip real estate than is required by a pass transistor (e.g., an NMOS transistor). In the FeRAM design in accordance with the invention, there is a trade off between selecting large groups in order to minimize the number of required CMOS plate line drivers and selecting small groups that do not include a number of inactive rows for every active row within a group, since all rows of a plate line group will contribute to the capacitive load imposed upon the associated driver. As an example, an array having 512 rows may have plate line groups consisting of 32 rows each, so that there will be at least 16 (=512/32) plate line groups. If each group includes less than the total number of columns, the total number of plate line groups will be a multiple of 16. For example, if there are 1024 columns and each group includes 64 columns, the FeRAM array will be 16 groups wide by 16 groups high.

As a first aspect of the invention, the grouping of plate lines enables the use of CMOS plate line drivers. While such drivers require a significant amount of area compared to NMOS transmission transistors, the plate line grouping allows the total number of CMOS drivers to be controlled. Moreover, the capacitive load per plate line is largely reduced, because a single plate line driver only needs to drive the cells of one active row and a relatively small number of cells on inactive rows (e.g., 31 rows). Since the load of an inactive row is approximately one percent of the load of the active row, the capacitive load upon a particular CMOS driver is manageable. In addition to the CMOS driver, each plate line group may be operatively associated with a separate decoder, while the overall circuitry is maintained within the area-related limitations of the integrated circuit chip. The use of CMOS drivers rather than NMOS eliminates the need for a boosted gate voltage in order to drive the plate voltage to the full supply level. Consequently, low-voltage applications of the architecture result in lower power and less gate oxide stress.

Thus, in accordance with the first aspect of the invention, CMOS drivers are used in a one-to-one correspondence with groups of plate lines. A plate line group may be associated with 32 word line rows. There may also be a one-to-one correspondence between the plate line drivers and decoders, such as NAND gate decoders. Each plate line group may extend through all of the columns, or may be limited to only a segment of the bit line columns. On the other hand, in accordance with a second aspect of the invention, the selection of a plate line driver is not limited to CMOS circuitry, but plate electrodes of the ferroelectric capacitors are interconnected on the basis of a partial group of rows and a partial segment of columns. The division of plate electrode connectivity based upon both row grouping and column segmenting may provide significant advantages in some applications, even when CMOS plate line drivers are not used.

DETAILED DESCRIPTION

Figure 5:
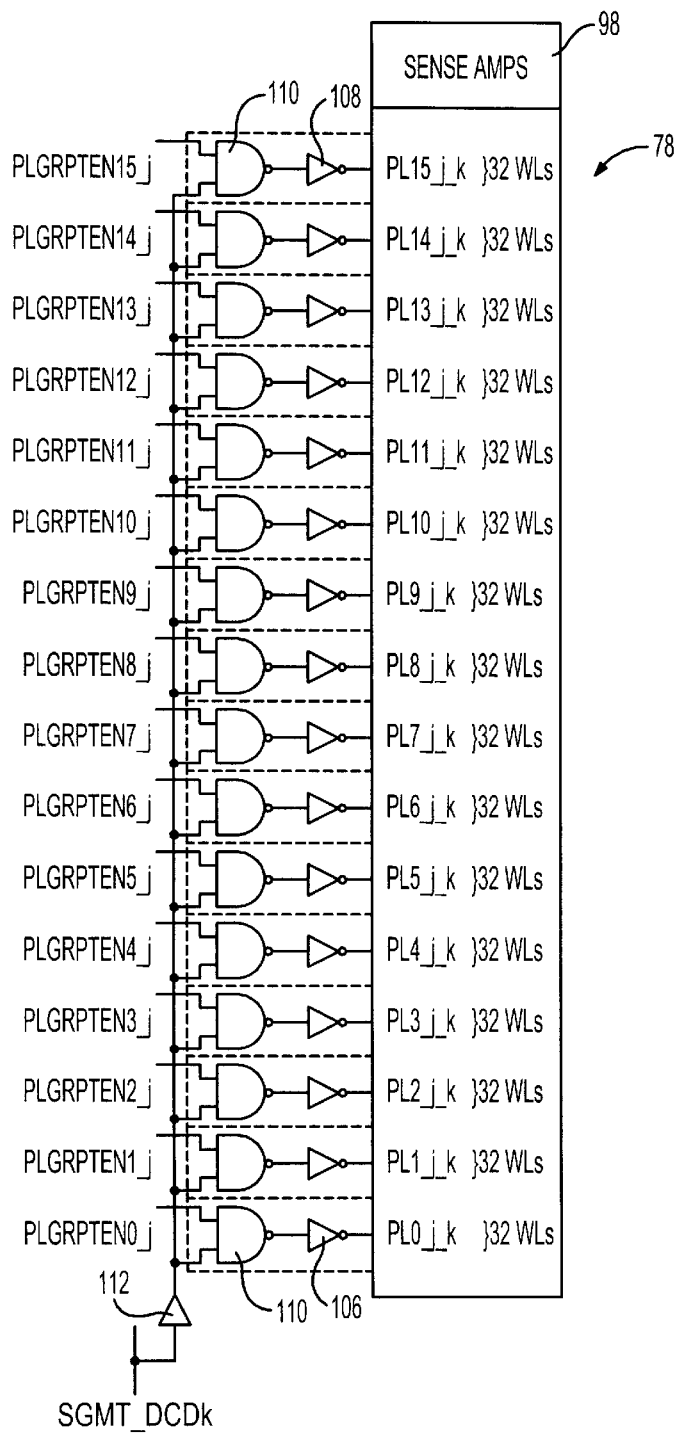
FIG. 5 is a schematic diagram of a circuit layout of plate line drivers for one segment of plate line groups for operating a FeRAM memory array in accordance with the invention.

With reference to FIG. 5, a single segment 78 of the plate line driver architecture is illustrated. In one possible implementation, the segment has 512 rows and 64 columns. A column may consist of either one bit line (open bit line) or two bit lines (folded bit line). Other arrangements may be used without diverging from the scope of the invention.

Figure 1:
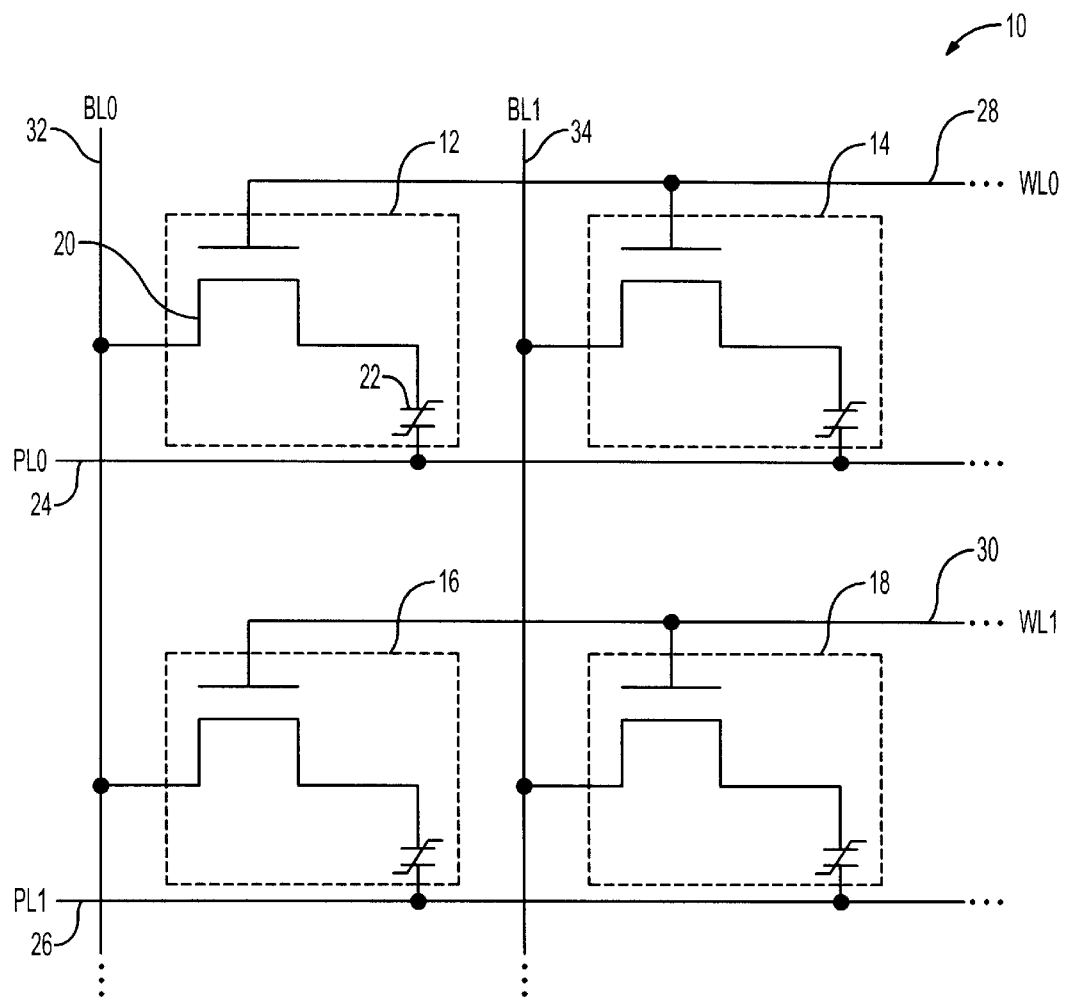
FIG. 1 is a schematic diagram of a FeRAM array of the type used in the present invention.
Figure 2:
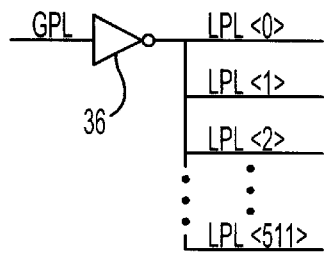
FIG. 2 is a schematic diagram of plate line connections using a known global plate line driver architecture.
Figure 3:
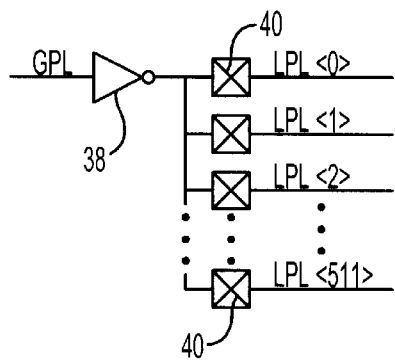
FIG. 3 is a schematic diagram of plate line drivers using a known segmented plate line driver architecture.
Figure 4:
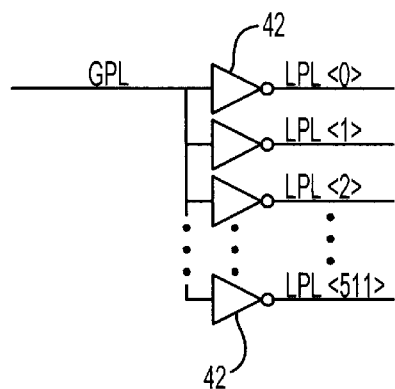
FIG. 4 is a schematic diagram of plate line drivers using a known local plate line driver architecture.
Figure 7:
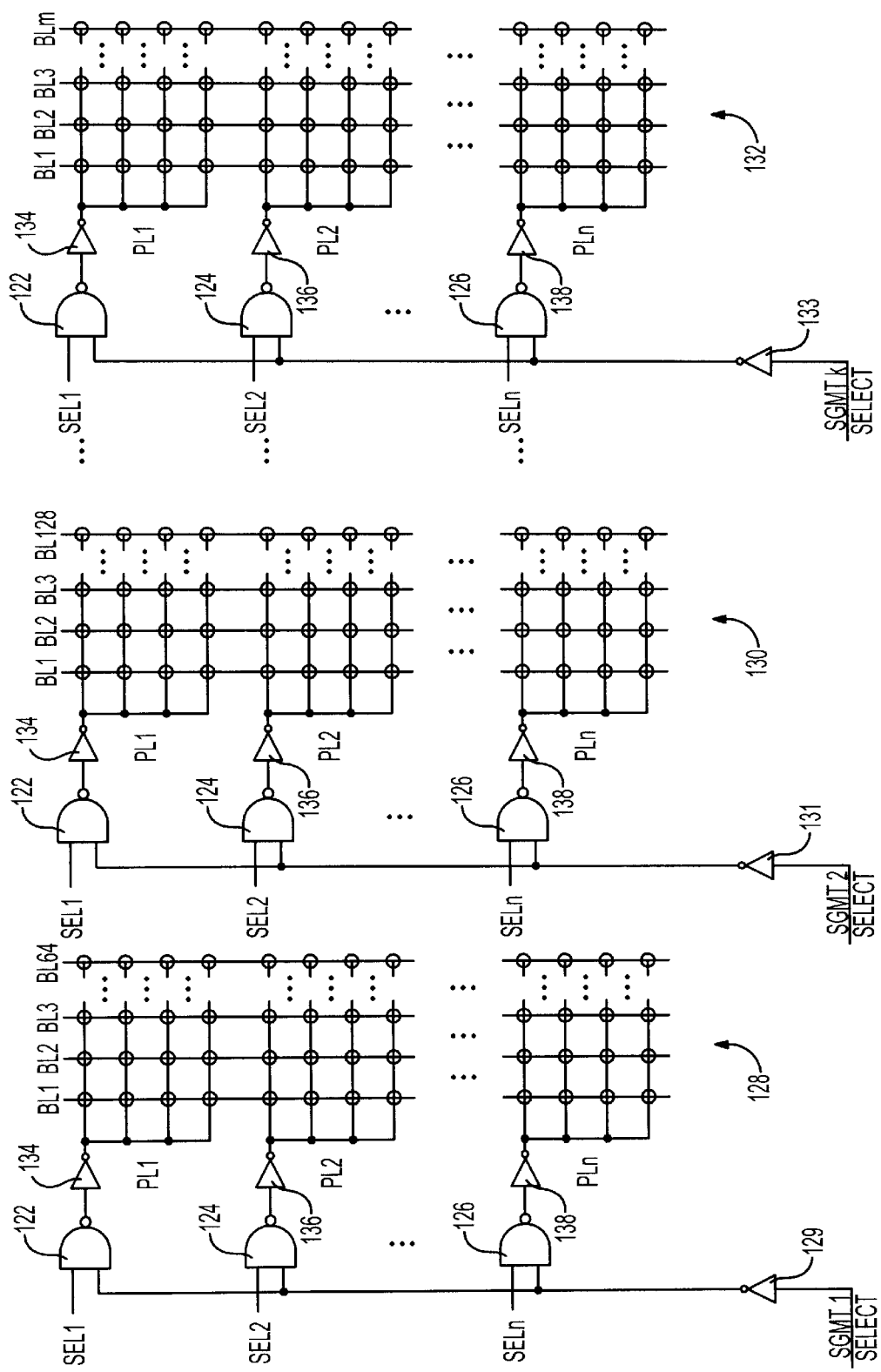
FIG. 7 is a schematic diagram of a layout of plate line groups for use in a FeRAM array in accordance with the invention.

Referring briefly to FIG. 7, three segments 128, 130 and 132 are illustrated as being divided into different plate line groups. Each circle that is bisected by one of the bit lines (BLm) and by one of the local plate lines (PLn) represents a single FeRAM cell. As was described with reference to FIG. 1, each FeRam cell 12, 14, 16 and 18 includes a switching device, such as a pass transistor 20, and a ferroelectric capacitor 22. A logical high at the output of a word line driver will turn "on" the pass transistors of the row of memory cells in the associated row in order to read or write data from or to the cells. Word line decoders and word line drivers are connected to activate pass transistors through all of the corresponding rows within a particular segment. Bit access via the bit lines may be controlled by means of the sense amplifiers 98 of FIG. 5. A conventional interdigitated column approach, as formed in many DRAMs, may be used.

In FIG. 5, plate group line drivers 106 and 108 are used to drive plate electrodes of FeRAM cells. In the encoding scheme for the illustrated embodiment, the letter "j" distinguishes a particular section of cells, while the letter "k" distinguishes a particular segment from the other segments of cells.

The number at the end of each plate group timed enable (PLGRPTEN) signal designates which one of the 16 plate groups is being addressed. However, the use of a NAND gate decoder 110 for each plate group ensures that there is access to the plate electrodes of the ferroelectric capacitors within the 32 rows of the associated group only when the segment 78 is active. When segment 78 is selected, a first driver 112 provides the necessary signal at one input of each NAND gate 110. The particular plate group to be driven, PL0–PL15, is triggered by its respective PLGRPTEN signal on the second input.

Dimensionally, the pitch of the word lines may be 0.6 µm. Consequently, the 32 word lines operatively associated with each plate group driver have a total height of 32×0.6=19.2 µm. To drive 64 columns requires a simple p-channel driver width within the range of 40 µm to 60 µm, depending on the desired speed for operating the memory array. The width needed to layout the plate group driver, including the NAND gate decoding, can be less than 10 µm. Consequently, the overhead for the plate group drivers used with a column pitch of 1.8 µm is less than eight percent (i.e., 10 µm/(1.8 µm×64)).

Figure 6:
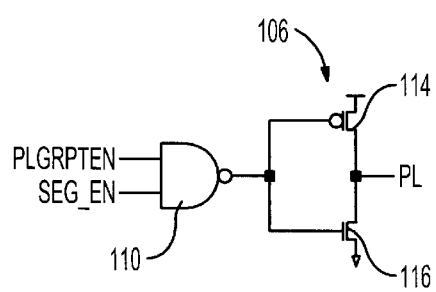
FIG. 6 is a schematic diagram of a decoder and a CMOS circuit for use in the segment of FIG. 5.

Referring to FIGS. 5 and 6, each plate line group is associated with a NAND gate 110 and a driver 106, which is preferably a CMOS circuit having cooperative n-channel and p-channel transistors 114 and 116 that enable low-voltage applications, since the CMOS circuit does not require voltage boosting. Moreover, since only one word line of the 32 rows is active at any one time, the plate group driver associated with the word line drives only 64 active cells. The memory cells within the remaining 31 rows are inactive and present only a smaller additional capacitive load to the driver. The additional load is a result of the ferroelectric capacitors in series with the much smaller storage node parasitic capacitances. By associating 32 rows with a single driver, sufficient height is available to layout a practical inverter driver and the small decoder. By connecting the CMOS driver directly to the plate line group, a very fast transition time can be achieved, allowing faster access time and shorter cycle times for the operation of the memory array.

FIG. 7 shows the plate line drive architecture from a multisegment perspective. Each segment 128, 130 and 132 has 64 columns, but the embodiment of FIG. 7 has a plate line grouping of four rows (rather than the 32-row grouping of FIG. 5). A segment enable driver 129, 131 and 133 in each of the three illustrated segments 120,130 and 132 provides one of the inputs for each NAND gate decoder 122, 124 and 126. The second input for each decoder is the plate group select signal. The output of each decoder connects to the operatively associated plate line driver 134, 136 and 138.

The segment enable drivers 129, 131 and 133 are individually connected to decoders (not shown) which are used to isolate the triggering of the drivers. Thus, a single segment 128, 130 and 132 of plate lines will be active at any one time. Moreover, the operations of the NAND gate decoders 122, 124 and 126 ensure that a single plate group will be driven within the active segment.

While only nine plate line groups are shown, a significantly larger number of plate line groups may be accommodated. Each group is operatively associated with a decoder 122, 124 and 126 and a plate line driver 134, 136 and 138. One advantage of the architecture is that the capacitive load per plate line is significantly reduced, as compared to architectures in which the global plate line driver 120 is connected directly to all of the plate lines. As described previously, the load of an active row is approximately 100 times larger than the load of an inactive row. Consequently, the three rows (in the embodiment shown in FIG. 7) that are not accessed via a word line do not add significantly to the capacitive load to the plate line driver. Moreover, the sharing of the plate lines allows the architecture to be very area efficient. The plate line drivers may be CMOS circuits, as described with reference to FIG. 6, but other types of drivers may be substituted. However, an advantage of using CMOS drivers is that a boosted gate voltage is not required.

What is claimed is:

1. An integrated device comprising:
   n×m lines of memory cells, where both n and m are greater than one, each said memory cell including a ferroelectric capacitor and a switching device, said memory cells being individually accessible via combinations of word lines and bit lines;

groupings of plate lines, each said grouping of plate lines providing a common connection to a plurality of said ferroelectric capacitors in each of a plurality of said m lines of memory cells and to each of a plurality of said ferroelectric capacitors in each of a plurality of said n lines of said memory cells; and a plurality of CMOS plate line drivers configured to drive said ferroelectric capacitors, each of said CMOS plate line drivers being uniquely associated with one of said groupings of plate lines.

2. The integrated device of claim 1 further comprising a plurality of plate line decoders, each said grouping of plate lines being uniquely associated with one of said plate line decoders, said plate line decoders being responsive to addressing signals so as to selectively trigger said plate line drivers.

3. The integrated device of claim 2 wherein each said plate line decoder is a NAND gate having a one-to-one correspondence with both said CMOS plate line drivers and the number of said groupings of plate lines.

4. The integrated device of claim 1 further comprising a global CMOS plate line driver connected to provide a common drive signal to said CMOS plate line devices.

5. The integrated device of claim 1 wherein said switching devices of said memory cells are transistors and each said word line is a shared connection to gates of said transistors in a specific line of said n lines of memory cells, each said bit line being a common connection to source/drains of said transistors in a particular line of said m lines of memory cells.

6. The integrated device of claim 5 wherein the number of said groupings of plate lines is divisible into n and said groupings are equal with respect to the portion of n lines with which each said grouping is operatively associated.

7. The integrated device of claim 6 wherein each said grouping of plate lines connects to said ferroelectric capacitors in only a segment of said m lines of said memory cells, each said grouping thereby being operatively associated with a portion of said n lines and a segment of said m lines of memory cells.

8. The integrated device of claim 1 wherein each said plate line driver includes at least one n-channel transistor and at least one p-channel transistor.

9. An integrated circuit device comprising:
   an array of ferroelectric memory cells arranged in pluralities of rows and columns, each said memory cell including a transistor and a ferroelectric element for storing a charge;

a plurality of word lines, each word line being coupled to gates of said transistors in a particular said row;

a plurality of bit lines, each bit line being coupled to source/drain regions of said transistors in a specific said column;

a plurality of CMOS plate drivers, each said CMOS plate driver being operatively coupled to a portion of said ferroelectric elements that includes ferroelectric elements from more than one said row and more than one said column; and a plurality of decoders, each said CMOS plate driver being responsive to a different decoder.

10. The integrated circuit device of claim 9 wherein each said portion of said ferroelectric elements to which one of said CMOS plate drivers is operatively coupled includes ferroelectric elements of said memory cells within a group of said rows and a segment of said columns, said group and said segment being less than all of said rows and less than all of said columns, respectively.

11. The integrated circuit device of claim 10 wherein the number of said ferroelectric elements in different said portions remains consistent.

12. The integrated circuit device of claim 9 wherein each said CMOS plate driver includes an n-channel transistor and a p-channel transistor, said CMOS plate drivers having a one-to-one correspondence with said decoders and with said portions of said ferroelectric elements.

13. The integrated circuit device of claim 9 wherein each said decoder is a NAND gate having a first input from an addressing signal and a second input from a global plate line.

14. The integrated circuit device of claim 13 further comprising a global plate line driver connected to said global plate line for uniformly manipulating said second inputs of an operatively associated plurality of said NAND gates.

15. A method of driving ferroelectric memory cells arranged in pluralities of rows and columns comprising the steps of:
   defining portions of said memory cells, each said portion including memory cells from more than one but less than all said rows and from more than one said column;
   connecting a different plate line driver to each said portion of memory cells, including forming said plate line drivers as CMOS circuits, wherein said connecting is to ferroelectric capacitors of said memory cells;
   associating each said plate line driver with a different decoder enabled to activate said associated plate line driver; and
   selectively activating said plate line drivers via said decoders to simultaneously drive all said ferroelectric capacitors in selected said portions of said memory cells.

16. The method of claim 15 wherein said defining of said portions includes assigning said memory cells such that each portion includes memory cells from a plurality of columns that is less than all of said columns.

17. The method of claim 15 wherein said associating includes assigning a NAND gate decoder to each said plate line driver.

18. The method of claim 17 further comprising controlling a global plate line driver to provide one input to all said NAND gate decoders, each said NAND gate decoder having an addressing signal as a second input.

19. The method of claim 15 further comprising selectively activating word lines and bit lines connected to said memory cells so as to perform read and write operations, each word line being coupled to gates of transistors within a particular said row, each bit line being coupled to source/drains of said transistors within a specific said column.

20. An integrated circuit having embedded memory comprising:
   an array of rows and columns of ferroelectric memory cells, each said memory cell having a switching device and a ferroelectric capacitor;
   a plurality of word lines connecting control inputs of said switching devices on a basis of said rows of said array, each said word line being dedicated to one of said rows;
   a plurality of bit lines connecting corresponding terminals of said switching devices on a basis of said columns of said array, each said bit line being dedicated to one of said columns; and
   a plurality of plate lines connecting groups of said ferroelectric capacitors on a basis of multi-row and multi-column portions of said array, each said group including ferroelectric capacitors of said memory cells in more than one but less than all said rows and in more than one but less than all said columns.

21. The integrated circuit of claim 20 further comprising a plurality of plate line drivers, each said plate line driver being dedicated to one of said groups such that there is a one-to-one correspondence between said groups and said plate line drivers.

22. The integrated circuit of claim 21 wherein said plate line drivers are CMOS circuits.

23. The integrated circuit of claim 20 wherein said array is divided into a plurality of sections, each said section having a separate set of said word lines, a separate set of said bit lines and a separate set of said plate lines.

24. The integrated circuit of claim 23 wherein said sections are arranged in a plurality of section rows and a plurality of section columns.

* * * * *